(12) United States Patent
Kiyota (10) Patent No.: US 10,916,913 B2
(45) Date of Patent: Feb. 9, 2021

(54) METHOD OF MANUFACTURING LIGHT EMITTING DEVICE USING SHRINK FITTING

(71) Applicant: NICHIA CORPORATION, Anan (JP)

(72) Inventor: Seiji Kiyota, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/996,471

(22) Filed: Aug. 18, 2020

(65) Prior Publication Data

US 2020/0381893 A1 Dec. 3, 2020

Related U.S. Application Data

(62) Division of application No. 14/757,431, filed on Dec. 23, 2015, now Pat. No. 10,784,647.

(30) Foreign Application Priority Data

Dec. 24, 2014 (JP) ................................. 2014-260495

(51) Int. Cl.
*H01S 5/022* (2006.01)
*F21K 9/64* (2016.01)
*H01S 5/02212* (2021.01)

(52) U.S. Cl.
CPC ............ *H01S 5/02296* (2013.01); *F21K 9/64* (2016.08); *H01S 5/02212* (2013.01); *H01S 5/02288* (2013.01)

(58) Field of Classification Search
CPC ............ H01S 5/02288; H01S 5/02212; H01S 5/0228; H01S 5/022; H01S 5/02296;
(Continued)

(56) References Cited

U.S. PATENT DOCUMENTS 2,707,418 A 5/1955 Magnuson
4,961,616 A 10/1990 Tada
(Continued)

FOREIGN PATENT DOCUMENTS

JP 03-044973 2/1991
JP 07-120643 A 5/1995
(Continued)

OTHER PUBLICATIONS

Final Office Action on U.S. Appl. No. 14/757,431 dated Oct. 4, 2019.
(Continued)

*Primary Examiner* — Bryon T Gyllstrom
*Assistant Examiner* — James M Endo
(74) *Attorney, Agent, or Firm* — Foley & Lardner LLP (57) ABSTRACT

A method of manufacturing a light emitting device includes: providing a first support member having an outer circumferential lateral surface and a first through-hole penetrating from an upper surface to a lower surface; disposing a light-transmissive member containing a fluorescent material in the first through-hole; providing a second support member having an inner circumferential lateral surface and a second through-hole penetrating from an upper surface to a lower surface, an inner dimension of the second support member being smaller than an outer dimension of the first support member at room temperature; and performing shrink fitting, which comprises heating the first support member and the second support member to increase the inner dimension of the second support member to be greater than the outer dimension of the first support member, thereafter disposing the first support member in the second support member.

13 Claims, 4 Drawing Sheets

(58) Field of Classification Search
CPC .. H01S 5/005; H01S 5/02292; H01S 5/02248; F21K 9/64; F21K 9/66; F21K 9/60; F21K 9/69; G02B 19/0052

See application file for complete search history.

(56) References Cited

U.S. PATENT DOCUMENTS

| | | |
|---|---|---|
| 5,027,259 A | 6/1991 | Chujko |
| 5,136,152 A | 8/1992 | Lee |
| 5,177,641 A | 1/1993 | Kobayashi et al. |
| 5,483,383 A | 1/1996 | Uziie et al. |
| 5,615,052 A | 3/1997 | Doggett |
| 5,926,326 A | 7/1999 | Fischer et al. |
| 6,483,030 B1 | 11/2002 | Glenn et al. |
| 6,917,481 B2 | 7/2005 | Shimizu et al. |
| 7,672,067 B2 | 3/2010 | Kawanami |
| 7,768,721 B2 | 8/2010 | Weber et al. |
| 2002/0075916 A1 | 6/2002 | Sato et al. |
| 2002/0085597 A1 | 7/2002 | Ohishi |
| 2003/0210719 A1 | 11/2003 | Yamamoto et al. |
| 2004/0120155 A1 | 6/2004 | Suenaga |
| 2004/0135510 A1 | 7/2004 | Bewlay et al. |
| 2005/0121687 A1 | 6/2005 | Yamada |
| 2008/0075406 A1 | 3/2008 | Kadomi et al. |
| 2008/0116473 A1 | 5/2008 | Sugiyama |
| 2008/0280079 A1 | 11/2008 | Watanabe |
| 2009/0003400 A1 | 1/2009 | Nagahama et al. |
| 2009/0212306 A1 | 8/2009 | Bogner et al. |
| 2011/0114352 A1 | 5/2011 | Miyazawa et al. |
| 2011/0122617 A1 | 5/2011 | Frey et al. |
| 2011/0149549 A1 | 6/2011 | Miyake |
| 2012/0057828 A1 | 3/2012 | Mitamura et al. |
| 2012/0127693 A1 | 5/2012 | Lai et al. |
| 2012/0170084 A1 | 7/2012 | Takeda et al. |
| 2013/0039461 A1 | 2/2013 | Rustad et al. |

FOREIGN PATENT DOCUMENTS

| | | |
|---|---|---|
| JP | 2004-031815 A | 1/2004 |
| JP | 2004-146466 A | 5/2004 |
| JP | 2004-146467 A | 5/2004 |
| JP | 2008-153617 A | 7/2008 |
| JP | 2009-272576 A | 11/2009 |
| JP | 2009-289976 A | 12/2009 |
| JP | 2012-094419 A | 5/2012 |

OTHER PUBLICATIONS

Final Office Action on U.S. Appl. No. 14/757,431 dated Nov. 15, 2018.
Non-Final Office Action on U.S. Appl. No. 14/757,431 dated Jan. 27, 2020.
Non-Final Office Action on U.S. Appl. No. 14/757,431 dated Jun. 12, 2019.
Notice of Allowance on U.S. Appl. No. 14/757,431 dated May 20, 2020.
U.S. Office Action on U.S. Appl. No. 14/757,431 dated Apr. 5, 2018.
Sugiyama, Semiconductor light-emitting device, Jul. 3, 2008, English, JP2008153617A.

METHOD OF MANUFACTURING LIGHT EMITTING DEVICE USING SHRINK FITTING

CROSS-REFERENCE TO RELATED PATENT APPLICATIONS

The present application is a divisional of U.S. patent application Ser. No. 14/757,431, filed Dec. 23, 2015, which claims priority to Japan Patent Application No. 2014-260495, filed Dec. 24, 2014, the contents of which are hereby incorporated by reference in their entireties.

BACKGROUND

1. Technical Field

The present disclosure relates to a light emitting device and a method of manufacturing the same.

2. Description of the Related Art

In recent years, a light emitting device using a light emitting element such as a laser diode as a light source has been proposed (for example, JP 2009-272576 A). Such a light emitting device may include a light emitting element, a case provided to cover the light emitting element, and a light-transmissive member that is arranged in a through-hole defined in the case and is configured to convert the wavelength of light emitted from the light emitting element. Recently, in order to improve heat dissipation performance and/or to facilitate maintenance of a light emitting device, instead of arranging a light-transmissive member within the through-hole, a light emitting device has been provided in which, a lower support member defining a recess is arranged over a light emitting opening that is provided in the case, a ceramics fluorescent material holder that contains a light-transmissive member is arranged over the recess of the lower support member, and an upper support member for preventing detachment of the fluorescent material holder is arranged over the fluorescent material holder.

However, in the case where such a light emitting device in which a fluorescent material holder containing a light-transmissive member is arranged in the case via a lower support member, is used, for example, as an in-vehicle headlight or the like under a repeatedly vibrating environment for a long period of time, the optical characteristic, particularly the luminous flux of light emitted from the light emitting device, may be reduced.

SUMMARY

In order to overcome such disadvantages as described above, a light emitting device according to certain embodiments of the present invention include, a first support member having an outer circumferential lateral surface and a first through-hole penetrating from an upper surface to a lower surface, a light-transmissive member disposed within the first through-hole and including a fluorescent material, a second support member having an inner circumferential lateral surface and a second through-hole penetrating from an upper surface to a lower surface, the second support member in contact with the outer circumferential lateral surface of the first support member and one of the upper surface and the lower surface of the first support member, and a light emitting element disposed below the first support member such that the emitting light is incident on the first through-hole and the second through-hole. At room temperature, the outer circumferential lateral surface of the first support member is fixed by the inner circumferential lateral surface of the second support member. At a temperature higher than a first temperature which is in a range of 200° C. to 800° C. inclusive, an outer dimension of the first support member is smaller than an inner dimension of the second support member. At room temperature, the outer dimension of the first support member without being fixed is greater than the inner dimension of the second support member without being fixed. The first temperature is a temperature at which the magnitude correlation between the outer dimension of the first support member and the inner dimension of the second support member is reversed.

A method of manufacturing a light emitting device according to certain embodiments of the present invention includes, providing a first support member having an outer circumferential lateral surface and a first through-hole penetrating from an upper surface to a lower surface, and disposing a light-transmissive member containing a fluorescent material in the first through-hole;

providing a second support member having an inner circumferential lateral surface and a second through-hole penetrating from an upper surface to a lower surface, an inner dimension of the second support member being smaller than an outer dimension of the first support member at room temperature;

performing shrink fitting, including heating the first support member and the second support member to a temperature higher than a first temperature which is in a range of 200° C. to 800° C. inclusive to increase the inner dimension of the second support member to be greater than the outer dimension of the first support member, arranging the first support member in the second support member, cooling the first support member and the second support member to a temperature lower than the first temperature, and fixing the outer circumferential lateral surface of the first support member with the inner circumferential lateral surface of the second support member; and arranging a light emitting element.

The term "first temperature" refers to a temperature at which the magnitude correlation between the outer dimension of the first support member and the inner dimension of the second support member is reversed.

The light emitting device according to certain embodiments of the present invention provides a light emitting device with which the luminous flux does not easily reduce even when the light emitting device is used in a vibrating environment.

The method of manufacturing a light emitting device according to the embodiments of the present invention provides a method of manufacturing a light emitting device with which the luminous flux does not easily reduce even when the light emitting device is used in a vibrating environment.

DETAILED DESCRIPTION OF EMBODIMENTS

In a conventional light emitting device in which a fluorescent material holder containing a light-transmissive member is disposed in a case via a lower support member, a small gap exists between the lower support member and the fluorescent material holder in a lateral direction (i.e., a perpendicular direction) relative to the emission direction. Due to the presence of the gap, the fluorescent material holder may be displaced in the lateral direction when the light emitting device is used in a vibrating environment for a long period of time. As a result, the luminous flux of light emitted from the light emitting device decreases.

As a result of a thorough study, the inventors of the embodiments of the present invention have found that the use of shrink fit (i.e., fixing the fluorescent material holder with the lower support member to which the fluorescent material holder is arranged), allows for a reduction in the decrease in the luminous flux of light emitted from the light emitting device. As will be detailed below, a light emitting device according to the embodiments of the present invention includes a fluorescent material holder and a lower support member fixed by shrink fit, so that shifting of the fluorescent material holder in the lateral direction can be prevented when the light emitting device is used in a vibrating environment for a long period of time. Further, since removal is easy, as compared to the case where fixing is carried out chemically through the use of an adhesive material or the like, ease of maintenance is achieved.

Embodiments of the present invention will be described in detail below with reference to the drawings. The light emitting device described in the following description is provided to embody the technical idea of the present invention, and not intended to limit the present invention thereto unless otherwise specified. Further, the content described in one embodiment is applicable to other embodiments. Note that, in the following description, while terms representing specific directions or positions are used as necessary (for example, "upper", "lower", "right", "left", "lateral" and other terms including such terms), these terms are used for facilitating understanding of the embodiments of the invention with reference to the drawings, and the technical scope of the embodiments of the present invention is not limited by the meaning of the terms. The parts denoted by the same reference characters appearing in a plurality of drawings are the same parts or members. The size or positional relationship of members in the drawings may be exaggerated for the sake of clarity.

First Embodiment

Figure 1:
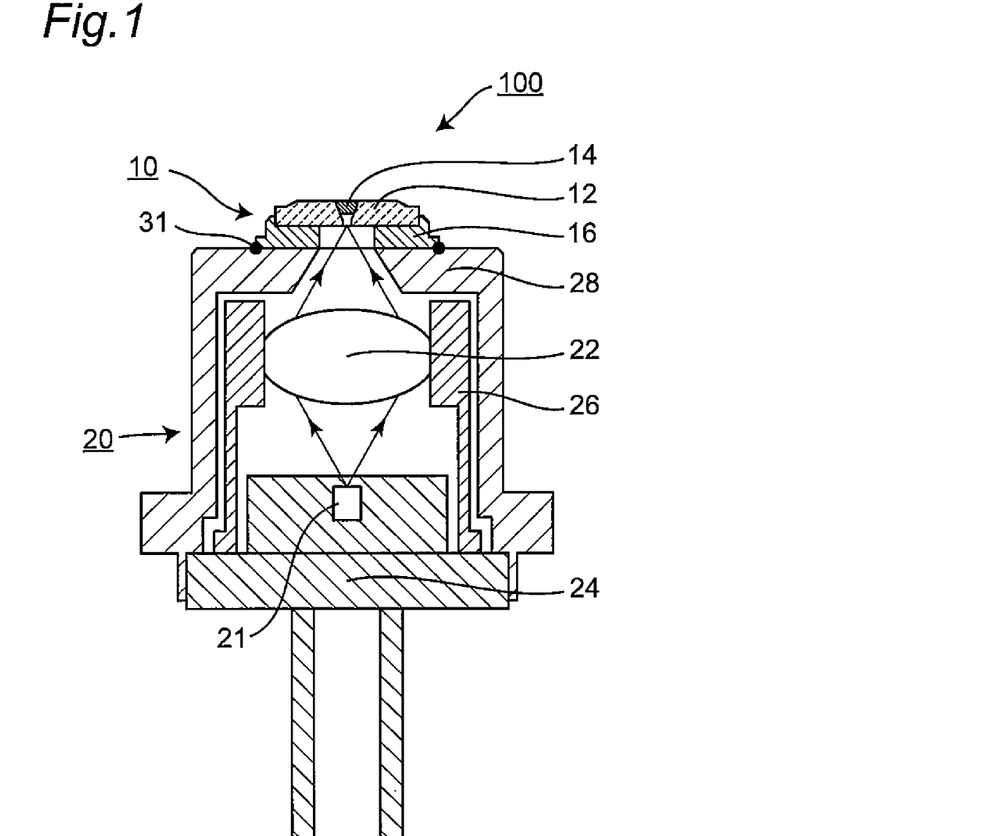
FIG. 1 is a schematic cross-sectional view illustrating an overall configuration of a light emitting device according to a first embodiment of the present invention.
Figure 2:
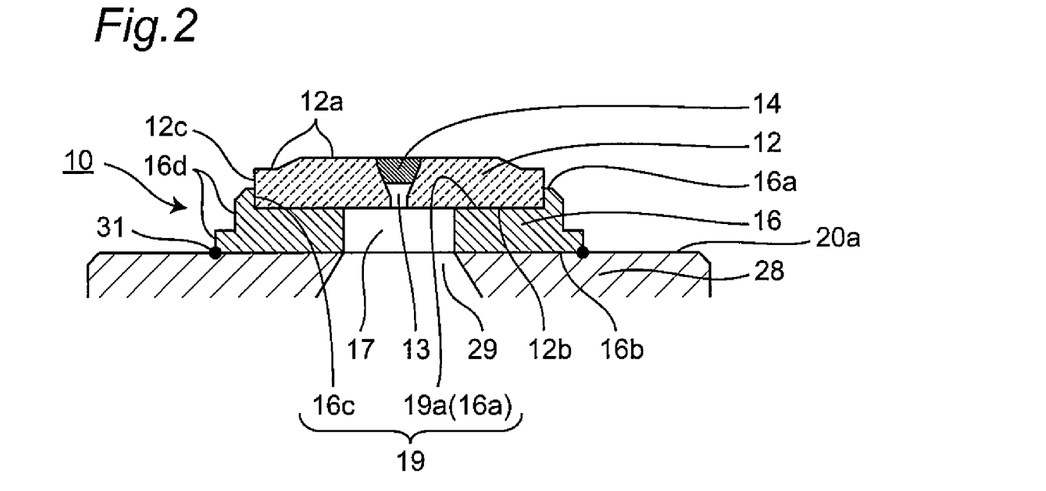
FIG. 2 is a schematic cross-sectional view of an optical wavelength converting unit of the light emitting device according to the first embodiment of the present invention.

FIG. 1 is a schematic cross-sectional view illustrating an overall configuration of a light emitting device according to a first embodiment. FIG. 2 is a schematic cross-sectional view illustrating the cross section of an optical wavelength converting unit 10. As illustrated in FIGS. 1 and 2, a light emitting device 100 according to the first embodiment includes a light source unit 20 configured to emit light, and an optical wavelength converting unit 10 disposed at an upper surface 20a of the light source unit 20 and configured to convert the wavelength of light emitted from the light source unit 20. The light source unit 20 includes a light emitting element 21, a condensing lens 22, and a case 28. The light emitted from the light emitting element 21 passes through the condensing lens 22 to be converged with a light emitting opening 29 provided to penetrate through part of the upper surface of the case 28, and input to the optical wavelength converting unit 10. The optical wavelength converting unit 10 includes a second support member 16 disposed at the upper surface 20a of the light source unit 20, a first support member 12 disposed on the second support member 16, and a light-transmissive member 14 disposed in the first support member 12. The wavelength of the light is converted by the light emitted from the light source unit 20 passing through the light-transmissive member 14 of the optical wavelength converting unit 10. The first support member 12 is also referred to as a "fluorescent material holder," and the second support member 16 is also referred to as a "lower support member."

In the following, the constituent elements will be described in detail.

Optical Wavelength Converting Unit

As illustrated in FIG. 2, the second support member 16 defines a recess 19. The recess 19 is defined by the lateral surface (hereinafter referred to as the "inner circumferential lateral surface 16c of the second support member") and a bottom surface 19a. The bottom surface 19a forms part of an upper surface 16a of the second support member 16. The second support member 16 also includes a second through-hole 17 penetrating from a bottom surface 19a of the recess 19 to a lower surface 16b. The second through-hole 17 is optically connected to the light emitting opening 29 of the light source unit 20. It is preferable that the outer circumferential edge of the second through-hole 17 aligns with the outer circumferential edge of the light emitting opening 29.

As illustrated in FIG. 2, the first support member 12 is disposed on the bottom surface 19a of the recess 19 of the second support member 16. The first support member 12 includes an upper surface 12a, a lower surface 12b, an outer circumferential lateral surface 12c continuous with the upper surface 12a and the lower surface 12b, and a first through-hole 13 penetrating from the upper surface 12a to the lower surface 12b. The first support member 12 is disposed such that its lower surface 12b is in contact with the bottom surface 19a of the recess 19 of the second support member 16, and the outer circumferential lateral surface 12c is in contact with the inner circumferential lateral surface 16c of the second support member 16.

As illustrated in FIGS. 1 and 2, the first through-hole 13 provided at the first support member 12 is provided so as to optically connect to the second through-hole 17 provided at the second support member 16 and the light emitting opening 29 provided at the light source unit 20. In the configuration illustrated in FIG. 2, in the lower surface 12b, the openings of the first through-hole 13 and the second through-hole 17 do not match with each other, but they may conform to each other. Further, in the configuration illustrated in FIG. 2, in the upper surface 20a, the openings of the second through-hole 17 and the light emitting opening 29 conform to each other, but they may be different from each other.

The shape of the first through-hole 13 can be appropriately defined. It may be defined by a lateral surface having a certain opening width or diameter relative to the propagation direction of the emitting light, or may be defined by a lateral surface increasing its opening width or diameter toward the propagation direction of the emitting light. Alternatively, the shape may be a combination of the foregoing. In the case where the width or the diameter increases toward the propagation direction of the emitting light, the shape of the first through-hole 13 may be a tapered shape or stepwise shape. In this manner, returning light of the light input to the first through-hole 13 can be reflected by the lateral surface of the first through-hole 13, and the light emitting device 100 can efficiently emit light.

As illustrated in FIGS. 1 and 2, the light-transmissive member 14 is disposed in the first through-hole 13. The light-transmissive member 14 contains a fluorescent material. The light emitted from light source unit 20 has its wavelength converted by passing through the light-transmissive member 14 containing the fluorescent material.

The optical wavelength converting unit 10 according to the first embodiment may have just one light-transmissive member 14, or may have a plurality of light-transmissive members 14. In the case where the optical wavelength converting unit 10 has a plurality of light-transmissive members 14, the plurality of light-transmissive members 14 may be disposed, for example, in the top-bottom direction. The plurality of light-transmissive members 14 may contain fluorescent materials of a same type, or may contain fluorescent materials of different types, respectively.

As illustrated in FIG. 2, by fixing, for example, by welding or the like, a first connection portion 31 where an outer circumferential lateral surface 16d of the second support member 16 and the upper surface 20a of the light source unit 20 are in contact with each other, the second support member 16 is fixed to the upper surface 20a of the light source unit 20. In this manner, since the optical wavelength converting unit 10 is fixed to the light source unit 20, displacement in the lateral direction relative to the emitting direction of the optical wavelength converting unit 10 can be prevented, even when the light emitting device 100 is used in a vibrating environment, and a reduction in the luminous flux of light emitted from the light emitting device 100 can be suppressed.

As illustrated in FIG. 2, the lower surface 12b of the first support member 12 is in contact with the bottom surface 19a of the recess 19 of the second support member 16, and the outer circumferential lateral surface 12c of the first support member 12 is in contact with the inner circumferential lateral surface 16c of the second support member 16. In this manner, heat generated at the light-transmissive member 14 by the light-transmissive member 14 being irradiated with light emitted from the light source unit 20 can be released to the second support member 16 via the first support member 12. Thus, a stable optical characteristic can be obtained.

In the following, fixing of the first support member 12 to the second support member 16 will be described in more detail.

Fixing by Shrink Fit

In the light emitting device 100 according to the first embodiment, the first support member 12 is fixed to the second support member 16 using the principle of shrink fit. By being fixed by shrink fit, the outer circumferential lateral surface 12c of the first support member 12, according to the first embodiment, receives compressive stress from the inner circumferential lateral surface 16c of the second support member 16 at the contact surface of the inner circumferential lateral surface 16c of the second support member 16. Thus, the first support member 12 inside the recess 19 is restricted from shifting in the lateral direction relative to the emitting direction, by the second support member 16. In this manner, by fixing the first support member 12 to the second support member 16 by shrink fit, displacement of the first support member 12 in the lateral direction, which is associated with vibrations during use, can be prevented. Accordingly, it becomes possible to suppress a reduction in the luminous flux of light emitted from the light emitting device 100 associated with use in a vibrating environment.

The optical wavelength converting unit 10 according to the first embodiment, is structured such that the first support member 12 and the second support member 16 have different coefficients of thermal expansion. Accordingly, when the first support member 12 and the second support member 16 are removed from the light emitting device 100, that is, are disassembled into individual members, their size relationship is different depending on the temperature of the environment.

Figure 3A:
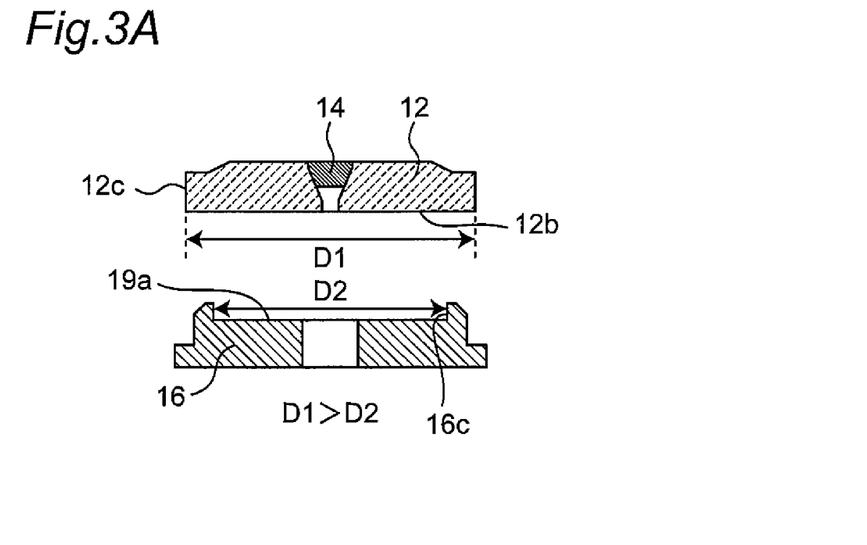
FIG. 3A is a schematic cross-sectional view of a first support member and a second support member of the optical wavelength converting unit at room temperature, in a state of being removed from the light emitting device according to the first embodiment of the present invention.
Figure 3B:
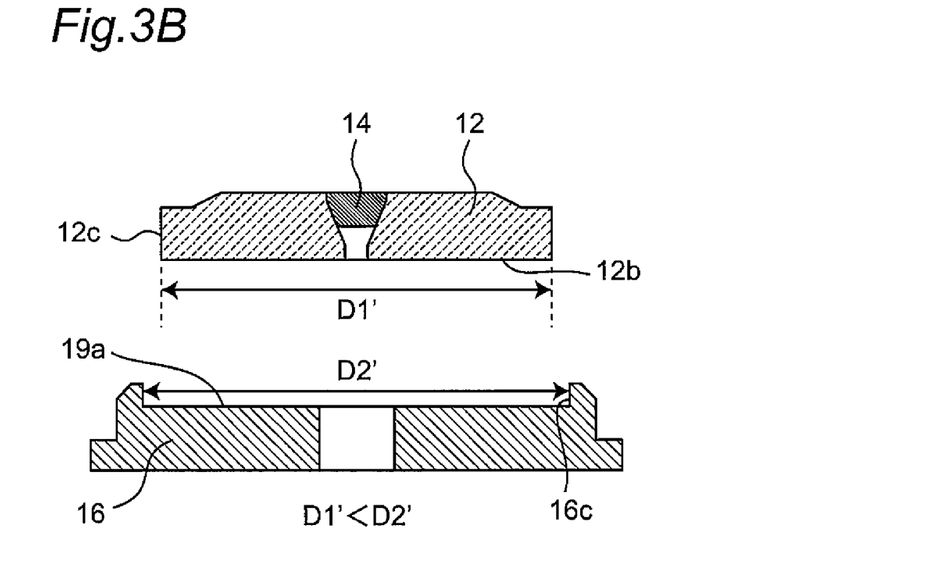
FIG. 3B is a schematic cross-sectional view of the first support member and the second support member of the optical wavelength converting unit at a temperature higher than a first temperature, in a state of being removed from the light emitting device according to the first embodiment of the present invention.

FIGS. 3A and 3B illustrate the first support member 12 and the second support member 16 in the state of being removed from the light emitting device 100, and disassembled into individual members, i.e., the first support member 12 is not restricted (or fixed) by the second support member 16.

FIG. 3A illustrates the first support member 12 and the second support member 16 at room temperature. In the state illustrated in FIG. 3A, when the outer dimension of the first support member 12 at room temperature is D1, and the inner dimension of the second support member 16 at room temperature is D2, the outer dimension D1 of the first support member 12 is greater than the inner dimension D2 of the second support member 16 (D1>D2).

FIG. 3B illustrates the first support member 12 and the second support member 16 at a temperature T' which is higher than a first temperature of which description will follow. In the state illustrated in FIG. 3B, when the outer dimension of the first support member 12 at the temperature T' is D1', and the inner dimension of the second support member 16 at the temperature T' is D2', the inner dimension D2' of the second support member is greater than the outer dimension D1' of the first support member at the temperature T' (D1'<D2').

The outer dimension D1 of the first support member 12 and the inner dimension D2 of the second support member 16 can be obtained by the following manner.

Two points where the outer circumferential lateral surface 12c of the first support member 12 and the inner circumferential lateral surface 16c of the second support member 16 are in contact with each other (contact portions) when used as the optical wavelength converting unit 10 are arbitrarily selected. Then, in the state where the first support member 12 and the second support member 16 are separated from each other, the distance between the two contact portions in the first support member 12 is regarded as D1, and the distance between the two contact portions in the second support member 16 is regarded as D2. That is, the outer circumferential lateral surface 12c on the left side of the first support member 12 and the inner circumferential lateral surface 16c on the left side of the second support member 16 illustrated in FIG. 3A are in contact with each other when used as the optical wavelength converting unit 10. Similarly, the outer circumferential lateral surface 12c on the right side of the first support member 12 and the inner circumferential lateral surface 16c on the right side of the second support member 16 illustrated in FIG. 3A are in contact with each other when used as the optical wavelength converting unit 10.

The outer dimension D1 and the inner dimension D2 may be measured by obtaining the cross section of the first support member 12 and the second support member 16, and measuring the cross section. Alternatively, measurement may be carried out without breaking the first support member 12 and the second support member 16.

As described above, although the two contact portions can be arbitrarily selected, preferably, the two contact portions are selected such that the distance between them is maximized. For example, when the shape of the inner circumferential lateral surface of the second support member 16 is circular in a top view, the two contact portions are preferably selected to be the opposite ends of the circle.

Further, the outer dimension D1' of the first support member 12 and the inner dimension D2' of the second support member 16 can be obtained by the method of obtaining the outer dimension D1 of the first support member 12 and the inner dimension D2 of the second support member 16 described above.

However, since the outer dimension D1' and the inner dimension D2' are dimensions measured at high temperatures of 200° C. or higher, it may be difficult to actually perform measurement. Accordingly, in place of actual measurement, by checking that the second support member 16 is not fixed (restricted) by the first support member 12 any longer while the optical wavelength converting member is heated from room temperature to temperatures up to 800° C. (temperatures equal to or higher than 200° C.), the fact that the inner dimension D2' of the second support member is greater than the outer dimension D1' of the first support member may be confirmed (D1'<D2'). For example, in the embodiment illustrated in FIG. 2, after the optical wavelength converting unit 10 is removed from the light source unit 20, the optical wavelength converting unit 10 is turned upside down from the state illustrated in FIG. 2, and heated to a temperature T' that is higher than the first temperature. Then, it may be checked that the first support member 12 comes off (or becomes spaced apart) from the second support member 16.

With the light emitting device 100 according to the first embodiment, the first support member 12 and the second support member 16 structuring the optical wavelength converting unit 10 have different coefficients of thermal expansion. The coefficient of thermal expansion of the second support member 16 is greater than the coefficient of thermal expansion of the first support member 12. Accordingly, as illustrated in FIG. 3A, although the outer dimension D1 of the first support member 12 is greater than the inner dimension D2 of the second support member 16 at room temperature, when the temperature of the first support member 12 and the second support member 16 is gradually increased from room temperature, the outer dimension of the first support member 12 and the inner dimension of the second support member 16 become gradually greater at different speeds. At the first temperature, the outer dimension of the first support member 12 and the inner dimension of the second support member 16 become equal to each other. As illustrated in FIG. 3B, at the temperature T', which is higher than the first temperature, the inner dimension D2' of the second support member 16 becomes greater than the outer dimension D1' of the first support member 12.

In FIG. 3A, the difference between the outer dimension D1 of the first support member 12 at room temperature and the inner dimension D2 of the second support member 16 at room temperature is preferably in a range equal to or smaller than 0.020 mm, when, for example, the outer dimension D1 of the first support member 12 at room temperature is about 4 mm. When the difference between the outer dimension D1 of the first support member 12 at room temperature and the inner dimension D2 of the second support member 16 at room temperature is excessively great, after the first support member 12 is fixed to the second support member 16 by shrink fit, the first support member 12 receives excessive compressive stress from the second support member 16 at room temperature. This causes early breakage of the optical wavelength converting unit 10. Setting the difference between the outer dimension D1 of the first support member 12 at room temperature and the inner dimension D2 of the second support member 16 at room temperature in a range equal to or smaller than 0.020 mm, it becomes possible to prevent the first support member 12 from being excessively tightened by the second support member 16 because of thermal contraction, and to suppress positional displacement of the light-transmissive member 14 caused by deformation of the first support member 12, for example, in the case where the light emitting device 100 according to the first embodiment is used as an in-vehicle headlight in cold climate areas (for example, at an operation temperature in a range of −55° C. to 0° C.). Accordingly, in this manner, it becomes possible to suppress a reduction in the luminous flux of light emitted from the light emitting device 100.

In a top view of the light emitting device 100 according to the first embodiment, the shape of the outer circumferential lateral surface 12c of the first support member 12 and that of the inner circumferential lateral surface 16c of the second support member 16 preferably substantially conform to each other. With such a shape, the outer circumferential lateral surface 12c of the first support member 12 and the inner circumferential lateral surface 16c of the second support member 16 can be brought into contact with each other with a relatively great area, whereby fixation of the first support member 12 by the second support member 16 becomes stable. Accordingly, even when the light emitting device 100 is used in a vibrating environment, positional displacement of the first support member 12 can be effectively suppressed, and a reduction in the luminous flux of light emitted from the light emitting device 100 can be suppressed. Further, by being brought into contact with a relatively great area, the force applied from the inner circumferential lateral surface 16c of the second support member 16 to the outer circumferential lateral surface 12c of the first support member 12 does not locally act on the outer circumferential lateral surface 12c of the first support member 12, and is dispersed over the entire outer circumferential lateral surface 12c of the first support member 12. Accordingly, even when used in a vibrating environment for a long period of time, distortion or breakage of the first support member 12 and the light-transmissive member 14 included in the first support member 12 caused by applied stress can be suppressed. Further, in this manner, the contact area between the first support member 12 and the second support member 16 increases, and heat from the light-transmissive member 14 generated by the light-transmissive member 14 being irradiated with light emitted from the light emitting element 21 can be more efficiently released to the second support member 16. Hence, a stable optical characteristic can be obtained.

In a top view of the light emitting device 100 according to the first embodiment, the shape of the outer circumferential lateral surface 12c of the first support member 12 and that of the inner circumferential lateral surface 16c of the second support member 16 are preferably circular. However, the embodiments of present invention are not limited thereto. That is, in a top view of the light emitting device 100, the shape may be polygonal. With any shape of the outer circumferential lateral surface 12c of the first support member 12 and shape of the inner circumferential lateral surface 16c of the second support member 16 that are in conformity to each other in a top view of the light emitting device 100, the effect of the embodiments of the present invention can be more effectively obtained.

Meanwhile, the shapes of the outer circumferential lateral surface 12c of the first support member 12 and the inner circumferential lateral surface 16c of the second support member 16 in a top view of the light emitting device 100 according to the first embodiment, may not substantially conform to each other. That is, even in the case where the shapes of the outer circumferential lateral surface 12c of the first support member 12 and the inner circumferential lateral surface 16c of the second support member 16 do not substantially conform to each other, so long as the outer circumferential lateral surface 12c of the first support member 12 and the inner circumferential lateral surface 16c of the second support member 16 are in contact with each other at two or more points that allow application of stress to each other, positional displacement of the first support member 12 and the light-transmissive member 14 included in the first support member 12 can be suppressed, even when used in a vibrating environment, and a reduction in the luminous flux of light emitted from the light emitting device 100 can be reduced.

With the light emitting device 100 according to the first embodiment, the material and size of the first support member 12 and the second support member 16 are selected such that the first temperature is in a range of 200° C. to 800° C. inclusive. The first temperature is preferably 200° C. or higher. With the light emitting device 100 according to the first embodiment, for example, when used as an in-vehicle headlight or the like, the temperature rises to nearly 180° C. Here, at the first temperature of 200° C. or higher, even when the temperature of the optical wavelength converting unit 10 reaches nearly 180° C. in use, the first support member 12 including the light-transmissive member 14 is fixed to the second support member 16 without coming off, and a reduction in the luminous flux associated with use can be suppressed. Further, the first temperature is set to 800° C. or lower. With the optical wavelength converting unit 10 according to the first embodiment, glass is formed at the inner wall of the first through-hole 13. By heating the glass to temperatures higher than or equal to the softening point, the inner wall of the first through-hole 13 and the light-transmissive member 14 are fixed by fusing. The softening point of the glass is in a range of 820° C. to 850° C., so that if the first temperature is 800° C. or higher when heating at the time of shrink fit, the glass used for fusing is reheated to the temperature equal to or higher than the softening point and softens. This may cause displacement of the light-transmissive member 14 in the first through-hole 13 that may result in a reduction in the optical characteristic of the light emitting device 100. Accordingly, the first temperature is set to 800° C. or lower, which is lower than 820° C. that is near the softening point of the glass.

In the first embodiment, the difference between the coefficients of thermal expansion of the first support member 12 and the second support member 16 is preferably in a range of, $29 \times 10^{-6}/°$ C. or lower, for example, when the outer dimension D1 of the first support member 12 at room temperature is about 4 mm. With the light emitting device 100 according to the first embodiment, when the difference between the coefficients of thermal expansion of the first support member 12 and the second support member 16 is in such a range, the first support member 12 is fixed with proper stress by the second support member 16, and a reduction in the luminous flux can be suppressed even when used in a vibrating environment.

In the following, a description will be given of main members and the like structuring the light emitting device 100.

First Support Member

The material comprising the first support member 12 may be, for example, silicon carbide, aluminum oxide, silicon nitride, aluminum nitride, titanium oxide, tantalum oxide, ceramic such as cermet, high-melting-point metals such as tungsten, tantalum, molybdenum, Kovar and the like, or a composite of the foregoing materials. Among others, a material exhibiting high reflectivity of light and high heat transmittance is preferable. Aluminum oxide is preferable.

The material comprising the first support member 12 is preferably a material having a coefficient of thermal expansion in a range of $11 \times 10^{-6}/°$ C. or lower. In the light emitting device 100 according to the first embodiment, when the coefficient of thermal expansion of the first support member 12 is in such a range, the preferred coefficient of thermal expansion of the second support member 16 is in a range of which description will follow, the first support member 12 is fixed with proper stress by the second support member 16, and a reduction in the luminous flux can be suppressed even when used in a vibrating environment.

Light-Transmissive Member

The light-transmissive member 14 has a light input surface and a light emitting surface having a diameter greater than that of the light input surface. The light-transmissive member 14 is formed into a frustum of cone shape in which the outer diameter is gradually increased from the light input surface toward the light emitting surface. The lateral surface of the light-transmissive member 14 has an inclination in conformity to the lateral surface of the first through-hole 13. When the light-transmissive member 14 is inserted into the first through-hole 13, the lateral surface of the light-transmissive member 14 and the lateral surface of the first through-hole 13 are in surface contact with each other. Further, the lateral surface of the light-transmissive member 14 that has an inclination in conformity to the lateral surface of the first through-hole 13 may be used as a bonding surface, and the bonding surface and the lateral surface of the first through-hole 13 can be bonded to each other via the adhesive layer containing glass.

The light-transmissive member 14 is preferably formed from a material with excellent light transmissivity. For example, the light-transmissive member 14 is preferably formed from a material with a light transmissivity by which light emitted from the light source (for example a laser diode) is transmitted by 50% or more, and further 70% or more. Further, preferably the light-transmissive member 14 is formed by a material with excellent lightfastness and heat withstanding properties with which no degradation occurs, even with irradiation of light of high intensity. For example, a material with a softening point in a range of 820° C. to 850° C. is preferable.

The material of the light-transmissive member 14 may be, for example, ceramic. More specifically, the material may be aluminum oxide such as alumina, sapphire or the like, silicon dioxide such as silica glass, zirconium oxide, barium oxide, titanium oxide, yttrium oxide, silicon nitride, aluminum nitride, silicon carbide or the like. These materials may be solely used, or in a combination of two or more of these materials. In view of providing properties such as excellent light transmissivity, melting point, heat transferring property and diffusing property, a material including aluminum oxide or silicon dioxide is preferable, and a material including aluminum oxide is more preferable. The light-transmissive member 14 may have a single-layer structure or a stacked-layer structure formed of a single material or a plurality of materials.

Fluorescent Material

The light-transmissive member 14 contains a fluorescent material. This makes it possible to form a light emitting device that emits light of a desired color hue.

The fluorescent material may be any appropriate known fluorescent material, according to, for example, the wavelength of the emitting light of the light source and the color of light it is desired to obtain. More specifically, cerium-activated yttrium aluminum garnet (YAG), cerium-activated lutetium aluminum garnet (LAG), europium- and/or chromium-activated calcium aluminosilicate containing nitrogen ($CaO-Al_2O_3-SiO_2$), europium-activated silicate (($Sr,Ba$)$_2SiO_4$), β sialon fluorescent material, a KSF-based fluorescent material ($K_2SiF_6$:Mn) or the like can be used. Particularly, it is preferable to use a fluorescent material that has heat resisting properties.

By using such fluorescent materials, a light emitting device that emits a mixed light of primary light and secondary light of a visible light wavelength (for example, white-color base), and a light emitting device that emits secondary light of a visible light wavelength excited by primary light of ultraviolet light can be obtained. In particular, it is desirable to use a fluorescent material that is excited by blue color and emits broad yellow color as the fluorescent material that emits white-color light in combination with a blue-color light emitting element.

The fluorescent material may be a combination of a plurality of types of fluorescent materials. For example, fluorescent materials such as $Sib-zAlzOzN_{8-z}$:Eu, $Lu_3Al_5O_{12}$:Ce, $BaMgAl_{10}O_{17}$:Eu, $BaMgAl_{10}O_{17}$:Eu,Mn, $(Zn,Cd)Zn$:Cu, $(Sr,Ca)_{10}(PO_4)_6C_{12}$:Eu,Mn, $(Sr,Ca)_2Si_5N_8$:Eu, $CaAlSiBxN_3+x$:Eu, $K_2SiF_6$:Mn and $CaAlSiN_3$:Eu may be used in any combination or mix ratio suitable for a desired color hue, so as to adjust the color rendering property or the color reproducibility. The fluorescent materials may be used in a combination in the light-transmissive member, or may be contained separately as a light-transmissive member of a stacked-layer structure.

Second Support Member

In consideration of weldability in performing laser welding, the material comprising the second support member 16 is preferably a material exhibiting high absorptance to, for example, a YAG laser, high heat releasing property, and excellent rust preventing property. For example, stainless steel is preferable, and austenite-based SUS304 is preferable among others.

The material structuring the second support member 16 is preferably a material having a coefficient of thermal expansion in a range of $40 \times 10^{-6}$/° C. or lower. In the case where the coefficient of thermal expansion of the second support member 16 is in such a range, and the coefficient of thermal expansion of the first support member 12 is in the range described above, the first support member 12 is fixed with appropriate stress by the second support member in the light emitting device 100 according to the first embodiment, so that a reduction in the luminous flux can be suppressed even when used in a vibrating environment.

Light Source Unit

As illustrated in FIG. 1, the light source unit 20 according to the first embodiment, includes a stem assembly 24, the case 28, the light emitting element 21, the condensing lens 22, and a lens cap 26.

Light Emitting Element

In the first embodiment, the light emitting element 21 is preferably a semiconductor laser element. As the semiconductor laser element, for example, a semiconductor laser having an emission peak wavelength in a range of, for example, 300 nm to 500 nm, preferably 400 nm to 470 nm, more preferably 420 nm to 470 nm can be used.

Representatively, an edge-emitting semiconductor laser element can be used.

Second Embodiment

In the following, a description will be given of a light emitting device 100 according to a second embodiment focusing on the differences from the first embodiment. The constituent elements of the light emitting device 100 according to the second embodiment, without any particular description, may be structured similarly to the corresponding constituent elements of the first embodiment.

The optical wavelength converting unit 10 according to the second embodiment is different from the optical wavelength converting unit 10 of the light emitting device 100 according to the first embodiment in that the optical wavelength converting unit 10 of the second embodiment includes a third support member 18 that is in contact with the first support member 12 and the second support member 16.

Third Support Member

Figure 4:
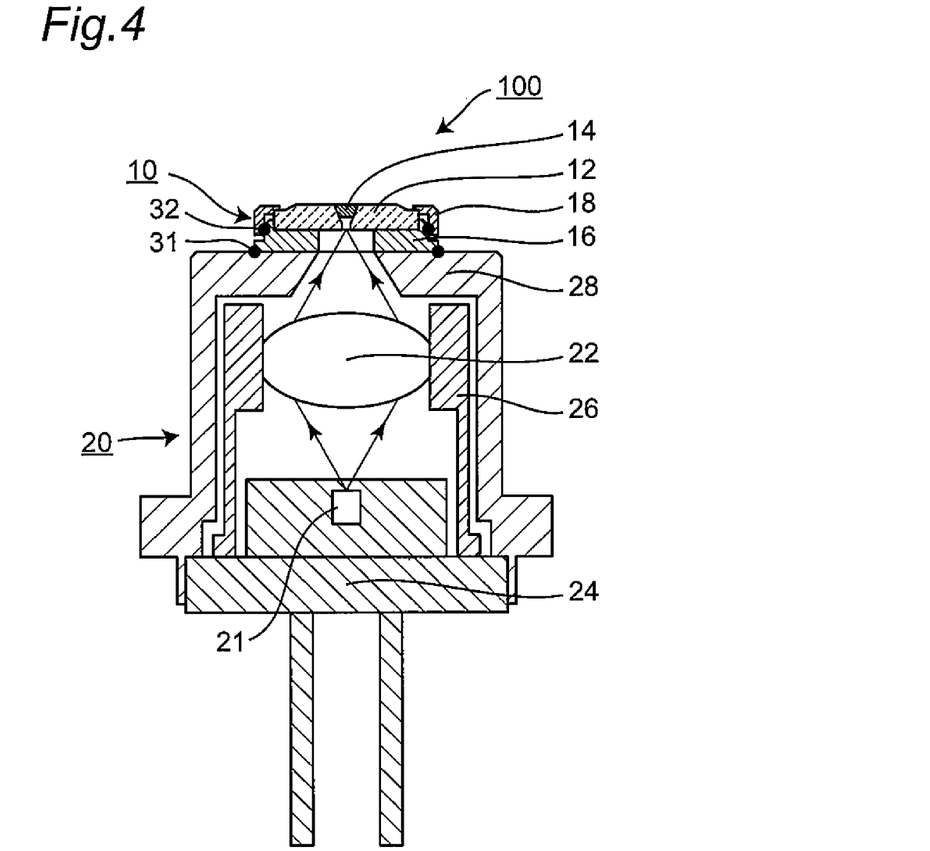
FIG. 4 is a schematic cross-sectional view illustrating an overall configuration of a light emitting device according to a second embodiment of the present invention.
Figure 5:
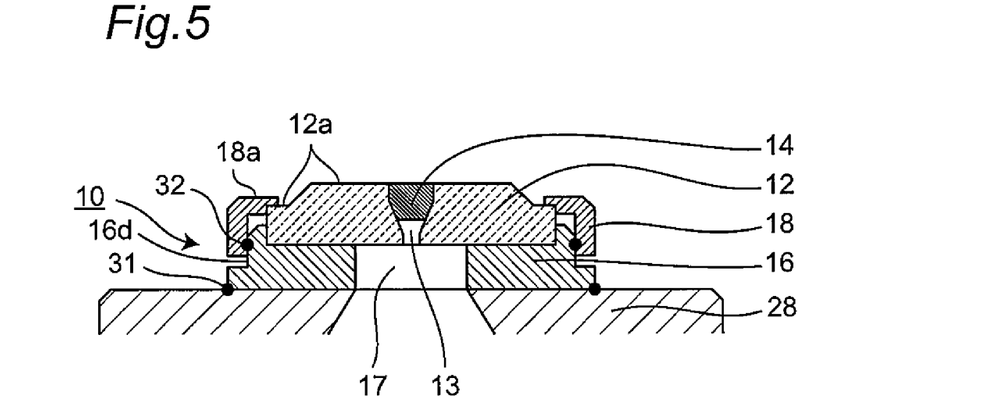
FIG. 5 is a schematic cross-sectional view of an optical wavelength converting unit of the light emitting device according to the second embodiment of the present invention.

FIG. 4 is a schematic cross-sectional view illustrating the overall structure of the light emitting device 100 according to the second embodiment. FIG. 5 is a schematic cross-sectional view illustrating the schematic cross-section of the optical wavelength converting unit 10. As illustrated in FIGS. 4 and 5, the light emitting device 100 may include the third support member 18 being in contact with the outer circumferential lateral surface 16d of the second support member 16 and the upper surface 12a of the first support member 12. The second support member 16 and the third support member 18 are in contact with each other at a second connection portion 32 on the outer circumferential lateral surface 16d of the second support member 16. The third support member 18 has the second connection portion 32, for example, welded or the like, thereby fixed to the outer circumferential lateral surface 16d of the second support member 16. The third support member 18 is disposed so as to be in contact with part of the upper surface 12a of the first support member 12, for example, an outer portion of the upper surface 12a. Accordingly, the second support member 16 and the third support member 18 are disposed so as to fix the first support member in the top-bottom direction. Provision of the third support member 18 in such a manner makes it possible to more effectively prevent displacement of the first support member 12 in the lateral direction associated with vibrations during use, and furthermore, to suppress displacement of the first support member in the top-bottom direction. Accordingly, a reduction in the luminous flux of light emitted from the light emitting device 100 associated with use can be more effectively suppressed. Further, provision of the third support member 18 makes it possible to relax the external shock applied to the optical wavelength converting unit 10, and prevent breakage of the optical wavelength converting unit 10. Thus, a reduction in the optical characteristic of the light emitting device associated with use can be suppressed.

As illustrated in FIG. 5, the upper surface 12a of the first support member 12 is preferably positioned higher than the upper surface 18a of the third support member 18, on the first through-hole side. In this manner, it becomes possible to prevent excitation light emitted from the light-transmissive member 14 containing the fluorescent material from being blocked by the third support member 18, and to improve the optical characteristic of the light emitting device 100.

Third Embodiment

In the following, a description will be given of a light emitting device 100 according to a third embodiment focusing on the differences from the other embodiments. The constituent elements of the light emitting device 100 according to the third embodiment, without any particular description, may be structured similarly to the corresponding constituent elements of other embodiments.

The optical wavelength converting unit 10 according to the third embodiment is different from the optical wavelength converting unit 10 according to the second embodiment in that: the third support member 18 has a recess, and is disposed at the upper surface 20a of the light source unit 20; the first support member 12 is disposed on a bottom surface 19a of the recess of the third support member 18; and the second support member 16 is disposed so as to be in contact with the upper surface 12a and the outer circumferential lateral surface 12c of the first support member 12.

Figure 6:
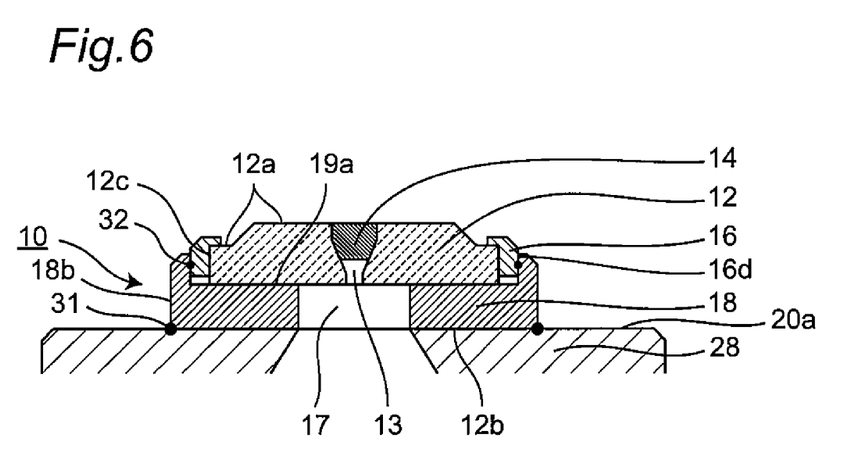
FIG. 6 is a schematic cross-sectional view of an optical wavelength converting unit of a light emitting device according to a third embodiment of the present invention.

FIG. 6 illustrates the optical wavelength converting unit 10 of the light emitting device 100 according to the third embodiment. As illustrated in FIG. 6, in the optical wavelength converting unit 10 according to the third embodiment, the second support member 16 is disposed so as to be in contact with the upper surface 12a and the outer circumferential lateral surface 12c of the first support member 12. Similar to the optical wavelength converting unit 10 according to other embodiments, the first support member 12 is fixed to the second support member 16 using the principle of shrink fit.

With the optical wavelength converting unit 10 according to the third embodiment, the third support member 18 is disposed on the upper surface 20a of the light source unit 20, so as to be in contact with the lower surface 12b of the first support member 12 and the outer circumferential lateral surface 16d of the second support member 16. When the first support member 12, the second support member 16, and the third support member 18 are disposed in this manner also, the movement of the first support member 12 in the lateral direction relative to the emitting direction is restricted by the second support member 16, and displacement of the first support member 12 in the lateral direction associated with vibrations during use can be prevented. Thus, a reduction in the luminous flux of light emitted from the light emitting device 100 associated with use can be suppressed.

In the third embodiment, the second support member 16 may be fixed to the third support member 18 by the second connection portion 32, where the outer circumferential lateral surface 16d of the second support member 16 and the third support member 18 are in contact with each other, for example, by welding. It is also possible that the third support member 18 is fixed to the upper surface 20a of the light source unit 20 by the first connection portion 31, where the outer circumferential lateral surface 18b of the third support member 18 and the upper surface 20a of the light source unit 20 are in contact with each other, for example, by welding. In such manners, even when the light emitting device 100 is used in a vibrating environment for a long period of time, positional displacement of the light-transmissive member 14 included in the first support member 12 can be suppressed, and a reduction in the luminous flux of the light emitted from the light emitting device 100 can be suppressed.

In the third embodiment, the lower surface 12b of the first support member 12 is in contact with the bottom surface 19a of the recess of the third support member 18, and the lower surface of the third support member 18 is in contact with the upper surface 20a of the light source unit 20. In this manner, the first support member 12 can efficiently release heat, which is generated by the light-transmissive member 14 through use of the light emitting device 100, to the case 28 of the light source unit 20 via the third support member 18. Thus, the stable optical characteristic of the light emitting device 100 can be obtained.

As illustrated in FIG. 6, the upper surface 12a of the first support member 12 is preferably positioned higher than the upper surface 16a of the second support member 16, on the first through-hole side. In this manner, it becomes possible to prevent excitation light emitted from the light-transmissive member 14 containing the fluorescent material from being blocked by the second support member 16, and the optical characteristic of the light emitting device 100 can be improved.

Fourth Embodiment

In the following, a description will be given of a light emitting device 100 according to a fourth embodiment focusing on the differences from other embodiments. The constituent elements of the light emitting device 100 according to the fourth embodiment, without any particular description, may be structured similarly to the corresponding constituent elements of other embodiments.

The optical wavelength converting unit 10 according to the fourth embodiment is different from the optical wavelength converting unit 10 according to the third embodiment in that the first support member 12 is directly disposed on the upper surface 20a of the light source unit 20 without having the third support member 18 interposed.

Figure 7:
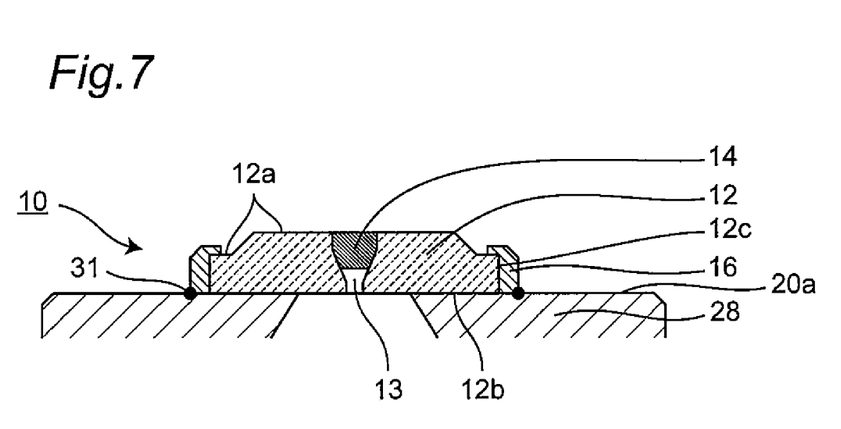
FIG. 7 is a schematic cross-sectional view of an optical wavelength converting unit of a light emitting device according to a fourth embodiment of the present invention.

FIG. 7 illustrates the optical wavelength converting unit 10 of the light emitting device 100 according to the fourth embodiment. As illustrated in FIG. 7, in the optical wavelength converting unit 10 according to the fourth embodiment, the first support member 12 is directly disposed on the upper surface 20a of the light source unit 20, and the second support member 16 is disposed so as to be in contact with the outer circumferential lateral surface 12c and the upper surface 12a of the first support member 12. Similar to the optical wavelength converting unit 10 according to other embodiments, the first support member 12 is fixed by the second support member 16 using the principle of shrink fit. The second support member 16 is fixed to the upper surface 20a of the light source unit 20 at the first connection portion 31, for example, by welding or the like. In this manner, even when the light emitting device 100 is used in a vibrating environment, positional displacement of the light-transmissive member 14 included in the first support member 12 can be suppressed, and a reduction in the luminous flux of light emitted from the light emitting device 100 can be suppressed.

As illustrated in FIG. 7, the lower surface 12b of the first support member 12 according to the fourth embodiment is in direct contact with the upper surface 20a of the light source unit 20. In this manner, the first support member 12 can efficiently release heat, which is generated by the light-transmissive member 14 through use of the light emitting device 100, to the case 28 of the light source unit 20. Thus, the stable optical characteristic of the light emitting device 100 can be obtained.

Method of Manufacturing

A method of manufacturing a light emitting device according to the present embodiments includes, disposing a light-transmissive member 14 containing a fluorescent material at a first support member 12 defining a first through-hole 13, forming an optical wavelength converting unit 10 by fixing the first support member 12 and a second support member 16 by shrink fit, and disposing the optical wavelength converting unit 10 at a light source unit 20 including a light emitting element 21.

Each manufacturing step will be described below.

Disposing Light-Transmissive Member

First, the first support member 12 having the outer circumferential lateral surface 12c and defining the first through-hole 13 penetrating from the upper surface 12a to the lower surface 12b is provided. Then, the light-transmissive member 14 containing a fluorescent material is disposed in the first through-hole 13 of the first support member 12, and is fixed by fusing using glass or the like as an adhesive material.

Performing Shrink Fitting

In performing shrink fitting, the first support member 12 is fixed to the second support member 16 by shrink fit.

More specifically, first, the second support member 16 that has the inner circumferential lateral surface 16c, the recess 19 provided in the upper surface 16a, and the second through-hole 17 penetrating from the upper surface 16a to the lower surface 16b, with its inner dimension D2 being smaller than the outer dimension D1 of the first support member 12 at room temperature is provided. Both the first support member 12 provided in the disposing the light-transmissive member and the second support member 16 are heated to increase the inner dimension of the second support member 16 and the outer dimension of the first support member 12 by thermal expansion. The temperature of the second support member 16 and the first support member 12 is raised to a temperature higher than the first temperature where the inner dimension of the second support member 16 becomes greater than the outer dimension of the first support member 12. At the temperature higher than the first temperature, the first support member 12 is disposed on the bottom surface 19a of the recess 19 of the second support member 16, such that the lower surface 12b of the first support member 12 is brought into contact with the bottom surface 19a of the recess 19. Thereafter, the first support member 12 and the second support member 16 are cooled to a temperature lower than the first temperature. Along with a decrease in the temperature, the outer dimension of the first support member 12 and the inner dimension of the second support member 16 are contracted. At a temperature lower than the first temperature, the outer circumferential lateral surface 12c of the first support member 12 is in contact with the inner circumferential lateral surface 16c of the second support member 16, and the first support member 12 is fixed to the second support member 16.

In the heating step in the performance of shrink fitting, the first support member 12 may not be heated and only the second support member 16 may be heated to increase the inner dimension of the second support member 16 by thermal expansion. According to such a heating, after disposing the first support member 12 on the bottom surface 19a of the recess 19 of the second support member 16 at a temperature higher than the first temperature, cooling of only the second support member 16 can be performed. This allows for an increase in cooling rate and a reduction in the cooling time that reduces the time required for the shrink fitting, so that productivity of the light emitting device according to the embodiments can be improved.

The shrink fitting is performed at a temperature higher than the first temperature which is in a range of 200° C. to 800° C. inclusive.

The heating in the shrink fitting may be performed through use of a hot plate using a heater or the like, high frequency induction heating, a gas furnace, an electric furnace or the like. In view of productivity, the heating is preferably performed through use of a hot plate. The cooling in the shrink fitting may be performed by water cooling or air cooling.

Through the foregoing manufacturing steps, the optical wavelength converting unit 10 of the embodiments of the present invention can be fabricated.

By connecting the optical wavelength converting unit 10 fabricated through the foregoing steps to the light source unit 20 including the light emitting element 21, the light emitting device 100 can be fabricated.

More specifically, first, the light source unit 20 including the light emitting element 21, the condensing lens 22 collecting the light from the light emitting element 21, the case 28 having the light emitting opening 29, and the stem assembly 24 is provided. Next, the optical wavelength converting unit 10 provided in the previous step is disposed on the case 28 such that the light emitting opening 29 of the case 28 and the second through-hole 17 of the optical wavelength converting unit 10 are optically connected. The first connection portion 31 where the optical wavelength converting unit 10 and the case 28 are in contact with each other is welded, for example by laser or the like, whereby the optical wavelength converting unit 10 and the case 28 are firmly fixed to each other, and the optical wavelength converting unit 10 and the light source unit 20 are connected to each other.

In connecting the optical wavelength converting unit 10 and the light source unit 20 to each other, a positional relationship between the case 28 and the optical wavelength converting unit 10 may be determined such that, when the optical wavelength converting unit 10 is disposed on the case 28, the light emitting element 21 is caused to emit light, and the light-transmissive member 14 is irradiated with the emitting light of the light emitting element 21. Then, excitation light from the light-transmissive member 14 is measured by a light receiving sensor such as a photodiode or the like to obtain a maximum measured value.

As shown in the above, a light emitting device and a method of manufacturing the light emitting device are illustrated in accordance with the embodiments for carrying out the present invention, but the scope of the invention is not limited to the above description, and should be widely understood based on the scope of claim for patent. Further, based on the above description, it will be obvious that various changes and modifications can be made therein without departing from the scope of the invention.

What is claimed is:

1. A method of manufacturing a light emitting device comprising:
   providing a first support member having an outer circumferential lateral surface and a first through-hole penetrating from an upper surface to a lower surface;
   disposing a light-transmissive member containing a fluorescent material in the first through-hole;
   providing a second support member having an inner circumferential lateral surface and a second through-hole penetrating from an upper surface to a lower surface, an inner dimension of the second support member being smaller than an outer dimension of the first support member at room temperature;
   performing shrink fitting, which comprises heating the first support member and the second support member to a temperature higher than a first temperature in a range of 200° C. to 800° C. inclusive to increase the inner dimension of the second support member to be greater than the outer dimension of the first support member, thereafter disposing the first support member in the second support member, thereafter cooling the first support member and the second support member to a temperature lower than the first temperature, and fixing the outer circumferential lateral surface of the first support member by the inner circumferential lateral surface of the second support member; and
   disposing a light emitting element,
   wherein the first temperature is a temperature at which a magnitude correlation between the outer dimension of the first support member and the inner dimension of the second support member is reversed.

2. The method according to claim 1, wherein an inner lateral surface of the first support member is inclined outward from a lower surface side toward an upper surface side of the first support member.

3. The method according to claim 2, wherein:
   an outer lateral surface of the light-transmissive member is inclined in conformity to the inner lateral surface of the first support member, and
   the step of disposing the light-transmissive member comprises bonding the outer lateral surface of the light-transmissive member and the inner lateral surface of the first support member to each other via an adhesive layer containing glass.

4. The method according to claim 1, wherein the light-transmissive member comprises a plurality of light-transmissive members of different types.

5. The method according to claim 1, wherein:
   the disposing the light emitting element comprises:
      providing a light source unit comprising the light emitting element, a condensing lens collecting light from the light emitting element, a case having a light emitting opening, and a stem assembly; and
      disposing on the case an optical wavelength converting unit comprising the first support member, the light-transmissive member and the second support member such that the light emitting opening of the case and the second through-hole of the second support member are optically connected to each other.

6. The method according to claim 1, wherein the light emitting element is a semiconductor laser element.

7. The method according to claim 1, wherein the step of disposing the first support member in the second support member comprises contacting the second support member with the lower surface of the first support member.

8. The method according to claim 7, further comprising:
   bonding a third support member to an outer circumferential lateral surface of the second support member,
   wherein the third support member is in contact with part of the upper surface of the first support member and restricts the first support member in a vertical direction.

9. The method according to claim 8, wherein the part of the upper surface of the first support member is positioned higher than the upper surface of the third support member.

10. The method according to claim 1, wherein the step of disposing the first support member in the second support member comprises contacting the second support member with the upper surface of the first support member.

11. The method according to claim 10, further comprising:
   bonding a third support member to an outer circumferential lateral surface of the second support member,
   wherein the third support member is in contact with part of the lower surface of the first support member and restricts the first support member in a vertical direction.

12. The method according to claim 11, wherein part of the upper surface of the first support member is positioned higher than the upper surface of the second support member.

13. The method according to claim 1, wherein the first support member consists essentially of a light reflecting aluminum oxide.

* * * * *